United States Patent
Lu et al.

(10) Patent No.: US 6,372,408 B1
(45) Date of Patent: Apr. 16, 2002

(54) METHOD OF REDUCING POST-DEVELOPMENT DEFECTS IN AND AROUND OPENINGS FORMED IN PHOTORESIST BY USE OF MULTIPLE DEVELOPMENT/RINSE CYCLES

(75) Inventors: Zhijian Lu, Poughkeepsie; Alan Thomas, Hughsonville; Alois Gutmann; Kuang Jung Chen, both of Poughkeepsie; Margaret C. Lawson, Millbrook, all of NY (US)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/598,374

(22) Filed: Jun. 21, 2000

(51) Int. Cl.[7] ............................. G03F 7/30; G03F 7/40
(52) U.S. Cl. ....................... 430/296; 430/309; 430/326; 430/327; 430/331; 430/996
(58) Field of Search .............................. 430/326, 327, 430/331, 296, 309, 966

(56) References Cited

U.S. PATENT DOCUMENTS

| | | | | |
|---|---|---|---|---|
| 5,292,605 A | | 3/1994 | Thomson | 430/30 |
| 5,759,749 A | * | 6/1998 | Fukuaka et al. | 430/331 |
| 6,238,848 B1 | * | 5/2001 | Konishi et al. | 430/327 |

\* cited by examiner

*Primary Examiner*—Richard L. Schilling

(57) ABSTRACT

In the exposure and development of available deep ultraviolet (DUV) sensitive photoresist it has been observed that following the standard prior art methods of exposure and development results in a high density of undesirable remnants (denoted as Blob Defects) of various components of photoresist material remaining on the semiconductor substrate (body). A method of exposing and developing the photoresist material which results in a reduced incidence of these Blob Defects consists of using a Puddle Development technique to develop the photoresist material, and subsequently exposing the semiconductor wafer to at least one Puddle Rinse cycle which uses water.

4 Claims, No Drawings

METHOD OF REDUCING POST-DEVELOPMENT DEFECTS IN AND AROUND OPENINGS FORMED IN PHOTORESIST BY USE OF MULTIPLE DEVELOPMENT/RINSE CYCLES

CROSS-REFERENCE TO RELATED APPLICATIONS

This application is related to U.S. Ser. No. 09/598,376, which is entitled "METHOD OF REDUCING POST-DEVELOPMENT DEFECTS IN AND AROUND OPENINGS FORMED IN PHOTORESIST BY USE OF NON-PATTERNED EXPOSURE". Both applications have one common inventor, a common assignee, and are being filed concurrently.

FIELD OF THE INVENTION

This invention relates to semiconductor fabrication lithography, lithographic resist, and the development of same, and to a method for reducing the incidence of undesired post-development defects, denoted as "Blob Defects", which may remain on a surface of a semiconductor wafer being processed after the development of the resist.

BACKGROUND OF THE INVENTION

As the minimum feature size of semiconductor devices has become smaller and smaller, new techniques, equipment and materials have been developed to meet the needs and requirements of those practicing the art of semiconductor fabrication. This has been especially true in the area of lithography, or more specifically, photolithography. As the size of the features of the semiconductor device have decreased from the thousandths of an inch (25000 nm) employed in initial semiconductor devices, to features with sizes of 130 nm, or less, the wavelength of the light employed to expose the photoresist has decreased from around 500 nm to 248 nm or less. This decrease in optical wavelength has required the development of new light sources, new equipment to project the image of a mask onto the surface of a semiconductor wafer (body), and new photoresist materials and photoresist developer materials. Present efforts are concentrated on the use of 248 nm deep ultraviolet (DUV) light. Several DUV sensitive photoresist materials have been developed and are in use in the industry. The characteristics important in a photoresist material include, among others, cost, sensitivity, adherence to the films in use, purity, reproducibility of characteristics, and most important, the ability to achieve a low density of photolithographic related defects.

DUV photoresist materials have been identified, and are in use around the world, which demonstrate most, but not all of these important characteristics. One of the required characteristics which has not been adequately demonstrated is the ability to achieve a low density of photolithographic related defects. Typically, most of the DUV photoresist materials which are in common use exhibit a class of post-development defects which are defined as "Blob Defects", in which fragments, pieces, or particles of the original components of the photoresist material, which should have been removed, remain in and around small openings in the photoresist after the photoresist has been exposed and developed, potentially blocking or partially blocking such openings. Such fragments of photoresist interfere with etching of the material under the photoresist, or with ion implantation or deposition through these openings in the photoresist. Such Blob Defects have been observed on semiconductor wafers being processed with all available DUV photoresists, regardless of the resist chemistry. The observation has been that the better the resist contrast and surface inhibition, the higher the Blob Defect density.

Modem photoresist materials are typically developed using a technique known as Puddle Development. The use of this technique is well known in the field of semiconductor lithography. This prior art method comprises the following steps. A semiconductor wafer which has been prepared with photoresist material and which has been exposed to the desired pattern of light is first given a post exposure bake and then cooled to near ambient room temperature. The photoresist is then developed as follows. The semiconductor wafer is placed on a spinner head and rotated at a high speed while a small amount of liquid, either developer solution or deionized water, is dispensed onto the surface of the semiconductor wafer to pre-wet the surface of the photoresist. The high speed of rotation generates sufficient centrifugal force to cause the liquid to be thrown off of the periphery of the semiconductor wafer as it is dispensed onto the central portion of the wafer. No liquid remains on the surface of the semiconductor wafer. The speed of rotation of the semiconductor wafer is then reduced to a lower value and a quantity of developer solution is dispensed onto the surface of the semiconductor wafer. The lower speed of rotation is such that centrifugal force spreads the developer solution out to the periphery of the semiconductor wafer, but the centrifugal force is insufficient to overcome the surface tension of the developer solution, and the developer solution is not thrown from the surface of the semiconductor wafer but remains as a pool, or puddle, on the surface. The puddle of developer solution is allowed to remain on the surface of the semiconductor wafer for a time sufficient to allow complete development of the exposed photoresist material. The speed of rotation is then increased to a higher value at which centrifugal force will cause the developer solution to be thrown from the surface of the semiconductor wafer. The semiconductor wafer is then rinsed and dried, completing the development of the photoresist.

It is known in the art to use multiple development steps in the development of photoresist material.

The selection of photoresist for contact hole lithography has become a compromise between defect density and lithographic performance. Blob defects have become a limiting factor in resist selection and yield enhancement.

It is desired to reduce the density of Blob Defects in the lithographic processing of semiconductor devices.

SUMMARY OF THE INVENTION

We have found that the fabrication of semiconductor devices can be improved and the density of a particular type of processing defect can be reduced by making changes to the method by which the photoresist is developed. The present inventive method of developing photoresist employs the use of at least one Puddle Development cycle and at least one Puddle Rinse cycle.

We denote the sequence of steps, as described in the Background of the Invention, from the dispensing of the puddle of developer through the time the developer is thrown from the surface of the semiconductor wafer as a "Puddle Development" cycle. We denote the same sequence of process steps, but in which deionized water is substituted for developer solution, as a "Puddle Rinse" cycle. When we wish to refer to either of these sequences we use the notation "Puddle" cycle.

When certain types of photoresist material are exposed to light and the photoresist is subsequently developed, it is found that particles of the components of the photoresist, denoted as "Blob Defects", can remain in and around the openings created in the photoresist. The photoresist material is composed of a mixture of various components, including a base polymer and photosensitive elements. The Blob Defects appear to be an aggregation of hydrophobic materials having low solubility in the photoresist developer solution. The mechanisms and dynamics by which these Blob Defects are formed and adhere to the structures being processed are not completely understood.

We have observed that by developing the photoresist using at least one Puddle Development cycle and at least one Puddle Rinse cycle, the density of such defects is reduced. In one particular experiment a reduction of defects by 98%, from 127 defects per wafer to 2 defects per wafer, was observed.

Viewed from a first aspect, the present invention is directed to a method of developing an exposed layer of photoresist material on a semiconductor wafer to reduce the incidence of Blob Defects. The method comprises the steps of developing the layer of photoresist first using a Puddle Development cycle, and upon completion of the Puddle Development cycle, subjecting the semiconductor wafer to a Puddle Rinse cycle. The semiconductor wafer may be subjected to multiple additional Puddle Rinse cycles.

Viewed from a second aspect, the present invention is directed to a method of developing an exposed layer of photoresist material on a semiconductor wafer to reduce the incidence of Blob Defects. The method comprises the steps of subjecting the semiconductor wafer to a sequence of Puddle cycles which are chosen from a group consisting of a Puddle Development cycle and a Puddle Rinse cycle, with at least one of the chosen cycles being a Puddle Development cycle.

Viewed from a third aspect, the present invention is directed to a method of developing an exposed layer of x-ray sensitive x-ray resist material on a semiconductor wafer to reduce the incidence of Blob Defects. The method comprises the steps of developing the layer of x-ray resist material first using a Puddle Development cycle, and upon completion of the Puddle Development cycle, subjecting the semiconductor wafer to a Puddle Rinse cycle.

Viewed from a fourth aspect, the present invention is directed to a method of developing an exposed layer of electron beam sensitive e-beam resist material on a semiconductor wafer to reduce the incidence of Blob Defects. The method comprises the steps of developing the layer of e-beam resist first using a Puddle Development cycle, and upon completion of the Puddle Development cycle, subjecting the semiconductor wafer to a Puddle Rinse cycle.

Viewed from a fifth aspect, the present invention is directed to a method of developing an exposed layer of ion beam sensitive resist material on a semiconductor wafer to reduce the incidence of Blob Defects. The method comprises the steps of developing the layer of ion beam sensitive resist first using a Puddle Development cycle, and upon completion of the Puddle Development cycle, subjecting the semiconductor wafer to a Puddle Rinse cycle.

The present invention will be better understood from the following more detailed description taken with the accompanying table and claims.

DETAILED DESCRIPTION

It has been observed that when DUV photoresist materials are developed using commonly employed photoresist development techniques an unacceptably high density of Blob Defects will remain on the semiconductor wafer after the completion of the development, rinse and dry sequence of operations. The present inventive method of developing photoresist employs the use of multiple Puddle cycles which have been found to effectively either prevent the formation of, or to remove previously formed Blob Defects from the surface of the semiconductor wafer.

The sequence of steps, as described in the Background of the Invention, from the dispensing of the puddle of developer through the time the developer is thrown from the surface of the semiconductor wafer is denoted as a "Puddle Development" cycle. Similarly, the same sequence of process steps, but in which deionized water is substituted for developer solution, is denoted as a "Puddle Rinse" cycle. When referring to the same sequence of steps, but using either deionized water or developer solution, the term "Puddle" cycle is used.

The essence of this invention, the use of Puddle Rinse cycles in addition to Puddle Development cycles, allows the simultaneous optimization of the development process and reduction in the density of Blob Defects. At least one of the Puddle cycles used in the present inventive method of developing photoresist must be a Puddle Development cycle.

It has been found that the effectiveness of this method in reducing the density of Blob Defects appears to be proportional to the total number of Puddle cycles used, and not on whether a Puddle Development or a Puddle Rinse cycle is used at a particular point in the sequence. Further, it has been found that the effectiveness of the inventive method is not reduced or changed if the semiconductor wafers are removed from the Puddle apparatus between cycles, or if the semiconductor wafer is allowed to dry between cycles.

Irrespective of the sequence of Puddle Development cycles used, it is understood that the semiconductor wafer must be exposed to the developer solution for a time sufficient to cause complete development of the photoresist, and that exposure to developer solution for an excessive length of time may cause degradation of the patterns in the photoresist. An appropriate choice of the number of Puddle Development cycles and the length of each cycle, and the number of Puddle Rinse cycles, allows an optimum balance to be achieved between proper development of the photoresist and maximum reduction of the density of Blob Defects.

Striking reductions in the density of Blob Defects have been observed when photoresist is developed using multiple Puddle Rinse cycles in conjunction with at least one Puddle Rinse cycle. In one particular experiment a reduction of defects by 98%, from 127 defects per wafer to 2 defects per wafer, was observed.

Table 1 illustrates the effect of multiple Puddle Development and Rinse cycles on the number of Blob Defects remaining on the surface of a semiconductor wafer after the completion of the exposure and development of the photoresist material. These data suggest that the reduction in the number of Blob Defects remaining on the semiconductor wafer after the completion of the development process depends only on the number of Puddle Development or Puddle Rinse cycles the semiconductor wafer has been subjected to, and not on the total length of development time, or whether the individual cycles are development or rinse cycles, so long as at least one Puddle Development and one Puddle Rinse cycle are used. From the point of view of minimizing the cost of processing a semiconductor wafer it is preferable to substitute as much as possible the use of deionized water for the use of developer solution when performing the described multiple Puddle cycles.

It is understood that this method of reducing the number of Blob Defects remaining on the semiconductor wafer may be combined with other methods of achieving such reductions. For example, the method of using multiple Puddle Development and Puddle Rinse cycles may be combined with the use of multiple patterned and non-patterned exposures, as described in the above identified related application being filed concurrently with this application.

TABLE 1

| | | | | | | | |
|---|---|---|---|---|---|---|---|
| Total No. of Puddle Cycles | 1 | 2 | 3 | 5 | 5 | 5 | 5 |
| Blob Defects per Wafer | 127 | 100 | 22 | 3 | 3 | 3 | 2 |
| Reduction in Defects from Using a Single Puddle Development Cycle | — | 21% | 83% | 98% | 98% | 98% | 98% |
| Total No. of Puddle Development Cycles and Times (sec.) | 1<br>1 @ 60 | 2<br>2 @ 26.6 | 3<br>3 @ 26.6 | 5<br>1 @ 26.6<br>4 @ 11.6 | 5<br>5 @ 26.5 | 5<br>5 @ 16.5 | 1<br>1 @ 60 |
| Total Development Time (sec.) | 60 | 53 | 80 | 73 | 133 | 83 | 60 |
| Total No. of Puddle Rinse Cycles and Times (sec.) | 0 | 0 | 0 | 0 | 0 | 0 | 4<br>4 @ 35 |

It is understood that the particular methods, materials and process steps described are merely illustrative of the general principles of this invention. Various modifications are possible without departing from the spirit and scope of the invention. For example, materials other than deionized water may be used in the Puddle Rinse cycles. The order in which the Puddle Rinse and Puddle Development cycles are carried out may be changed. Resist materials other than photoresist may be used, in particular, electron beam (e-beam) sensitive resist or x-ray sensitive resist may be used. Exposure of the resist by means other than light may be used, in particular exposure of the resist by electron beams, ion beams or x-ray beams. The concepts described herein may be applied to all types of devices and structures where it is necessary to create an opening in a resist layer and to minimize the amount of undesirable resist material remaining on a surface or in an opening in the resist after the resist material has been removed from the opening.

What is claimed is:

1. A method of developing an exposed layer of photoresist material on a semiconductor wafer to reduce the incidence of Blob defects comprising:

developing the layer of photoresist first using a Puddle Development cycle;

upon completion of the Puddle Development cycle, subjecting the semiconductor wafer to a Puddle Rinse cycle; and subjecting said semiconductor wafer to multiple additional Puddle Rinse cycles.

2. A method of developing an exposed layer of x-ray sensitive x-ray resist material on a semiconductor wafer to reduce the incidence of Blob Defects comprising:

developing the layer of x-ray resist material first using a Puddle Development cycle;

upon completion of the Puddle Development cycle, subjecting the semiconductor wafer to a Puddle Rinse cycle; and subjecting said semiconductor wafer to multiple additional Puddle Rinse cycles.

3. A method of developing an exposed layer of electron beam sensitive e-beam resist material on a semiconductor wafer to reduce the incidence of Blob Defects comprising:

developing the layer of e-beam resist first using a Puddle Development cycle;

upon completion of the Puddle Development cycle, subjecting the semiconductor wafer to a Puddle Rinse cycle; and subjecting said semiconductor wafer to multiple additional Puddle Rinse cycles.

4. A method of developing an exposed layer of ion beam sensitive resist material on a semiconductor wafer to reduce the incidence of Blob Defects comprising:

developing the layer of ion beam resist first using a Puddle Development cycle;

upon completion of the Puddle Development cycle, subjecting the semiconductor wafer to a Puddle Rinse cycle; and subjecting said semiconductor wafer to multiple additional Puddle Rinse cycles.

* * * * *